(12) United States Patent
Lee et al.

(10) Patent No.: US 7,411,345 B2
(45) Date of Patent: Aug. 12, 2008

(54) ORGANIC ELECTROLUMINESCENT DISPLAY HAVING DESICCANT LAYER INCLUDING AT LEAST ONE HOLE

(75) Inventors: Ho-Seok Lee, Yongin-si (KR); Won-Kyu Choe, Seoul (KR)

(73) Assignee: Samsung SDI Co., Ltd., Suwon (KR)

( * ) Notice: Subject to any disclaimer, the term of this patent is extended or adjusted under 35 U.S.C. 154(b) by 516 days.

(21) Appl. No.: 10/989,022

(22) Filed: Nov. 16, 2004

(65) Prior Publication Data

US 2005/0104513 A1 May 19, 2005

(30) Foreign Application Priority Data

Nov. 17, 2003 (KR) ............... 10-2003-0081209

(51) Int. Cl.
*H01J 1/62* (2006.01)
*H01J 63/04* (2006.01)

(52) U.S. Cl. ................... 313/512; 313/506
(58) Field of Classification Search .......... 313/498–512
See application file for complete search history.

(56) References Cited

U.S. PATENT DOCUMENTS

| | | | |
|---|---|---|---|
| 6,284,342 B1 | 9/2001 | Ebisawa et al. | |
| 6,737,176 B1 | 5/2004 | Otsuki et al. | |
| 2001/0028218 A1* | 10/2001 | Mashiko et al. | 313/553 |
| 2003/0203551 A1 | 10/2003 | Cok et al. | |
| 2003/0230978 A1 | 12/2003 | Hishida | |
| 2004/0092197 A1 | 5/2004 | Wei et al. | |

FOREIGN PATENT DOCUMENTS

| | | |
|---|---|---|
| CN | 1450838 A | 10/2003 |
| EP | 1 139 698 A2 | 10/2001 |
| JP | 2001-35659 | 2/2001 |
| JP | 2001-345173 | 12/2001 |
| JP | 2003-157969 | 5/2003 |
| JP | 2003-297559 | 10/2003 |
| JP | 2005-032689 | 2/2005 |
| TW | 558913 | 10/2003 |

* cited by examiner

*Primary Examiner*—Karabi Guharay
*Assistant Examiner*—Bumsuk Won
(74) *Attorney, Agent, or Firm*—H.C. Park & Associates, PLC

(57) ABSTRACT

In particular, one embodiment of the present invention provides an organic electroluminescent display which comprises a light emitting device formed on a lower insulating substrate, and an upper substrate mounted to encapsulate the light emitting device, wherein the upper substrate is provided with a desiccant, the desiccant being formed with at least one hole passing through the desiccant.

16 Claims, 1 Drawing Sheet

ORGANIC ELECTROLUMINESCENT DISPLAY HAVING DESICCANT LAYER INCLUDING AT LEAST ONE HOLE

CROSS-REFERENCE TO RELATED APPLICATION

This application claims the benefit of Korean Patent Application No. 2003-81209 filed on Nov. 17, 2003, which is herein incorporated by reference.

BACKGROUND OF THE INVENTION

1. Field of the Invention

The field of the present invention relates to organic electroluminescent displays (OLEDs) generally, and, more particularly, to an OLED containing a desiccant formed with holes therein which prevent bubbles from forming when the desiccant is adhered to a substrate or other substantially planar surface.

2. Description of the Related Art

OLEDs offer a thinner dimension, wider viewing angle, lighter weight, smaller size, quicker response time, and lower power consumption, as compared to a cathode ray tube (CRT) display or liquid crystal display (LCD). Moreover, OLEDs can be easily fabricated using simple manufacturing processes because its simple structure includes only three major elements, namely an anode electrode, an organic material layer, and a cathode electrode. Because of these and other advantages OLEDs are emerging as the next generation of flat panel displays.

In an OLED configured in the conventional manner, an organic light emitting device is formed on a lower insulating substrate, with an upper substrate disposed above the organic light emitting device.

A significant disadvantage associated with this configuration is that materials used to form the organic light emitting layer and cathode electrode have insufficient resistance against moisture and/or oxidation. This weakness deteriorates the reliability of the display over time. In particular, internal oxidation and/or accumulation of moisture causes areas of the display to become non-emissive. Such non-emissive areas are called "dark spots". As time goes by, the dark spots spread to neighboring areas and eventually destroy the entire display.

In an attempt to solve the foregoing problem, a conventional OLED encapsulates the organic light emitting layer and the cathode electrode to protect them against moisture and oxygen. The process involves forming a desiccant placing recess in an encapsulation substrate made of a glass material; adhering a desiccant in the recess; and bonding the encapsulation substrate to an insulating substrate with a sealant. The bonding process is performed in an inert gas such as nitrogen ($N_2$), argon (Ar) or the like, to prevent the encapsulation of atmospheric moisture and oxygen.

Conventionally, the desiccant material is formed on a layer of adhesive material and to a thickness of about 200 μm. The desiccant material is made of barium oxide (BaO), calcium carbonate ($CaCO_3$), calcium oxide (CaO), phosphor oxide ($P_2O_5$), Zeolite, Silicagel, Alumina, and like elements and compounds which eliminate moisture by physisorption or chemisorption.

A significant disadvantage of using the method described above is that a gas trapped between the desiccant and a substrate will form bubbles as the desiccant is adhered to the substrate. The bubbles place portions of the desiccant into contact with the organic light emitting device, which is problematic because the moisture accumulated by the desiccant eventually penetrates the organic light emitting device and makes it non-emissive.

Conventional attempts to solve the bubble problem included forming a deep desiccant placing recess to a depth of about 350 μm. This depth prevented protruding and non-protruding areas of the bubble-deformed desiccant from contacting the light-emitting device. However, because the thickness of the substrate is proportional to the depth of the desiccant placing recess, the deep desiccant placing recess necessitates a thick substrate. This, in turn, creates a heavier OLED.

SUMMARY OF THE INVENTION

In one embodiment of the present invention, the OLED includes a desiccant formed with at least one hole therein. The hole prevents bubbles from forming when the desiccant is adhered to a substrate or other substantially planar surface by permitting gas trapped between the desiccant and the substrate to escape.

In particular, one embodiment of the present invention provides an organic electro luminescence display, comprising: a light emitting device formed on a lower insulating substrate; and an upper substrate mounted to encapsulate the light emitting device, wherein the upper substrate is provided with a desiccant, the desiccant being formed with at least one hole passing through the desiccant.

Figure 1:
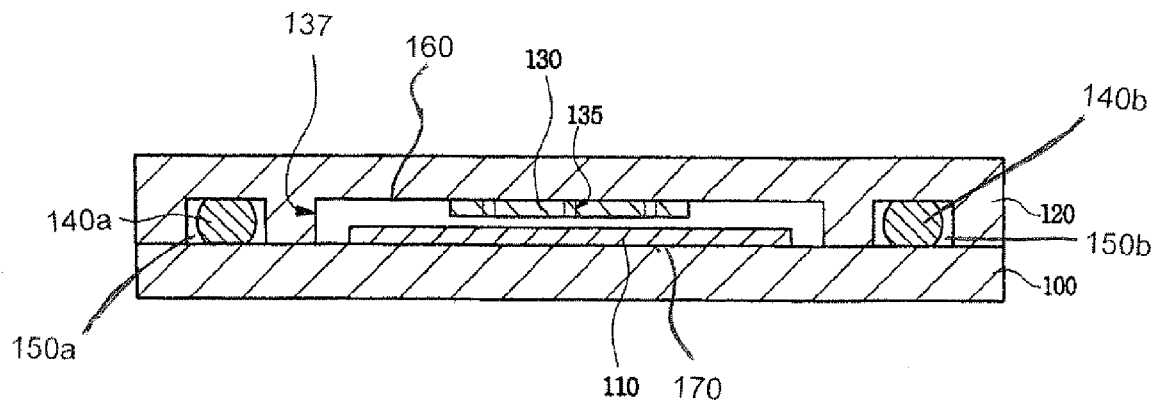
FIG. 1 is a cross-sectional view illustrating an organic electroluminescent display configured in accordance with an embodiment of the present invention.

In the drawings, the thickness of layers and regions are exaggerated for clarity.

DETAILED DESCRIPTION OF THE INVENTION

FIG. 1 is a cross-sectional view of an organic electroluminescent display configured in accordance with an embodiment of the present invention.

As shown in FIG. 1, the organic electroluminescent display includes a lower insulating substrate 100, an organic light emitting device 110 formed on the lower insulating substrate 100, and an upper substrate 120 having a desiccant placing recess 137 to which a desiccant 130 formed with at least one hole 135 is adhered to an inner surface of the desiccant placing recess 137. The hole 135 of the desiccant 130 acts to prevent bubbles from forming as the desiccant 130 is adhered to the upper substrate 120.

As shown, the upper substrate 100 further includes sealing recesses 150A, 150B, which bond to a sealant 140A, 140B, such that the upper substrate 120 is bonded to the lower substrate and encapsulates the organic, light-emitting device 110.

In one embodiment, the organic light emitting device 110 includes a first electrode, an organic emission layer, and a second electrode, wherein when the first electrode is used as an anode electrode, the second electrode is used as a cathode electrode, and vice versa.

The organic emission layer can be composed of various layers according to its function. In one exemplary embodiment, the organic emission layer is of a multiple-layer structure that includes an emission layer and at least one of a hole injecting layer (HIL), a hole transporting layer (HTL), a hole blocking layer (HBL), an electron transporting layer (ETL) and an electron injecting layer (EIL).

The layer of desiccant 130 is made of at least one material selected from a group consisting of barium oxide (BaO), calcium carbonate ($CaCO_3$), calcium oxide (CaO), phosphor oxide ($P_2O_5$), Zeolite, Silicagel, Alumina, and the like. A layer of adhesive material such as a sticker or adhesive thin film, may be used to adhere the desiccant 130 to the upper substrate 120. In one embodiment, the desiccant 130 is a strip of preformed material.

Figure 2A:
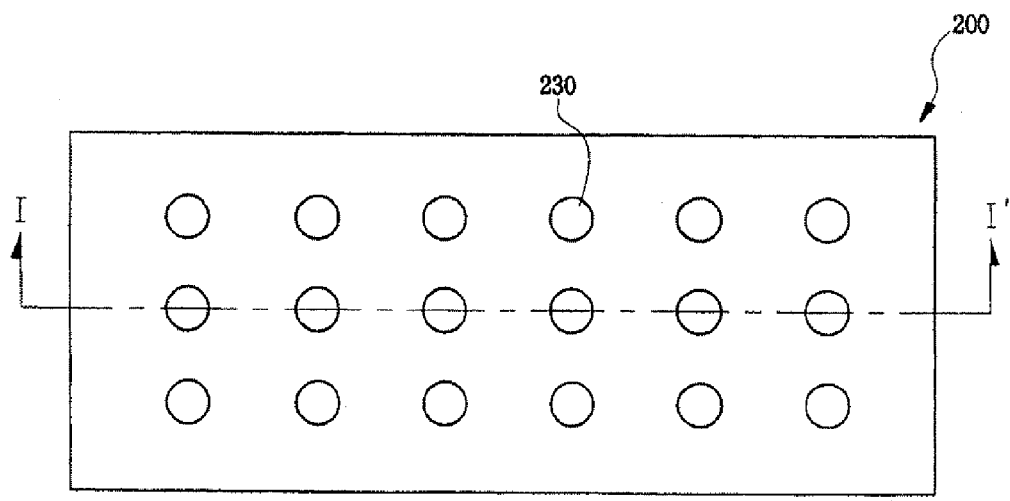
FIG. 2A is a plan view illustrating a desiccant used in an organic electroluminescent display configured in accordance with an embodiment of the present invention.
Figure 2B:
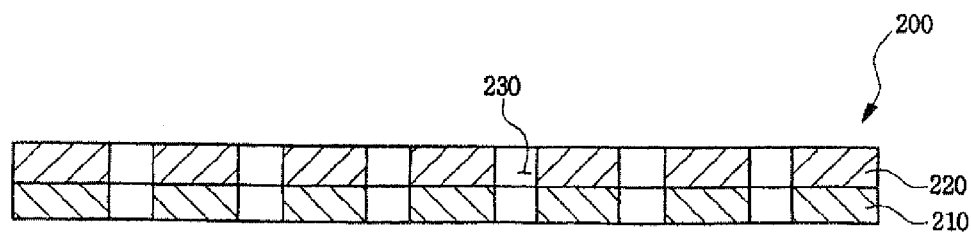
FIG. 2B is a cross-sectional view taken along line I-I' of FIG. 2A.

FIG. 2A is a plan view illustrating a desiccant used in an OLED configured in accordance with an embodiment of the present invention. FIG. 2B is a cross-sectional view taken along line I-I' of FIG. 2A.

Referring to FIGS. 2A and 2B, desiccant 200 may include a layer of desiccant material 220 formed on a layer of adhesive material 210. A plurality of holes 230 formed in the desiccant 200 pass through the desiccant 200 from side to side. The layer of desiccant material 220 absorbs moisture, and the layer of adhesive material 210 affixes the layer of desiccant material 200 to the upper substrate 120. In one embodiment, the layer of desiccant material 220 has a thickness of less than about 200 μm.

The holes 230 prevent gas bubbles from forming when the desiccant 200 is adhered to the upper substrate 120, and may have various shapes such as, but not limited to, circular, rectangular, and triangular shapes. To effectively prevent the formation of the bubbles, each hole 230 should have a circular shape of diameter of more than about 1.0 mm. In one embodiment the diameter of each hole is in the range of about 1.0 mm to about 2.0 mm. If the diameter of the hole 230 is too small, bubbles will form as the desiccant 200 is adhered. Oppositely, if the diameter of the hole 230 is too large, it is difficult to keep the desiccant 200 in a film form, and there are problems adhering the desiccant 200 to the substrate 120.

In an exemplary embodiment, the holes 230 formed through the desiccant 200 occupy an area of less than 6% of the total area of the desiccant 200. In particular, the holes 230 may occupy an area in the range of about 1% to about 6% of the total area of the desiccant 200. If the area occupied by the holes exceeds more than about 6%, the desiccant's moisture absorbing qualities tend to decrease.

On the other hand, the number of the holes 230 formed in the desiccant 200 may increase as the area of the desiccant 200 increases. Thus a large desiccant 200 may include more holes than a smaller desiccant. In one embodiment, the desiccant holes number between about 13,000/$m^2$ to 20,000/$m^2$, and are formed to extend through the desiccant material from a top surface thereof to a bottom surface thereof.

To prevent the formation of bubbles the desiccant 200 may be formed with at least one hole per 1 $cm^2$.

In an OLED configured as described above, gas bubbles are prevented from forming between the desiccant 130, 200 and the upper substrate (120) because a gas normally trapped between the desiccant and the substrate is released through the holes 230. Releasing the trapped gas causes the desiccant 130, 200 to lie flat without contacting the organic light-emitting device. Two benefits incur from this. First, the formation of dark spots is prevented. Second, the desiccant placing recess can be formed in depths of about 350 μm or less, as measured from an inner surface 160 of the recess on which the desiccant is adhered to an outer surface 170 of the substrate 100 on which the light-emitting device is formed.

In this manner, the thickness of the upper substrate 120 can be reduced to create a lightweight OLED suitable for mobile transport.

While the present invention has been described with reference to embodiments, it is understood that the disclosure has been made for purpose of illustrating the invention not to limit the scope of the invention. The embodiments herein described may be modified and changed without departing from the scope and spirit of the invention.

What is claimed is:

1. An organic electroluminescent display, comprising:
a light emitting device formed on a lower insulating substrate; and
an upper substrate mounted to encapsulate the light emitting device,
wherein the upper substrate is provided with a desiccant, the desiccant being formed with a plurality of holes passing through the desiccant, the at least one hole having a circular shape and a diameter of more than 1 mm.

2. The organic electroluminescent display as claimed in claim 1, wherein the upper substrate is provided with a desiccant placing recess.

3. The organic electroluminescent display as claimed in claim 2, wherein the depth of the desiccant placing recess is less than 350 μm.

4. The organic electroluminescent display as claimed in claim 1, wherein the hole of the desiccant prevents bubbles from forming while the desiccant is adhered.

5. The organic electroluminescent display as claimed in claim 1, wherein the holes occupy an area of less than 6% of the whole area of the desiccant.

6. The organic electroluminescent display as claimed in claim 5, wherein the holes occupy an area of 1% to 6% of the whole area of the desiccant.

7. The organic electroluminescent display as claimed in claim 1, wherein the number of the holes is between 13,000/$m^2$ and 20,000/$m^2$.

8. The organic electroluminescent display as claimed in claim 1, wherein the desiccant is provided with at least one hole per 1 $cm^2$.

9. The organic electroluminescent display as claimed in claim 1, wherein the desiccant is composed of a desiccant material layer and an adhesive material layer, the adhesive material layer being employed to fix the desiccant onto the upper substrate.

10. The organic electroluminescent display as claimed in claim 9, wherein the desiccant material layer is composed of at least one material selected from a group consisting of barium oxide (BaO), calcium carbonate ($CaCO_3$), calcium oxide ($CaO_3$), phosphor oxide ($P_2O_5$), Zeolite, Silicagel, and Alumina.

11. The organic electroluminescent display as claimed in claim 9, wherein the desiccant material layer has a thickness of less than 200 μm.

12. An organic electroluminescent display, comprising:
a light emitting device formed on a lower insulating substrate; and
an upper substrate mounted to encapsulate the light emitting device, wherein the upper substrate is provided with a desiccant, the desiccant being formed with a plurality of holes passing through the desiccant and each hole of the desiccant has a diameter of 1 mm to 2 mm.

13. An organic electroluminescent display, comprising:
a light emitting device formed on a lower insulating substrate;

an upper substrate mounted to encapsulate the light emitting device; and a desiccant comprising a desiccant material layer and an adhesive material layer, the adhesive material layer fixing the desiccant material layer onto the upper substrate, wherein at least one hole passes through the desiccant material layer and the adhesive material layer and exposes a surface of the upper substrate, and wherein the holes occupy an area of less than 6% of the whole area of the desiccant.

14. The organic electroluminescent display as claimed in claim 13, wherein the desiccant is provided with at least one hole per 1 $cm^2$.

15. The organic electroluminescent display as claimed in claim 13, wherein the hole of the desiccant has a triangular shapes.

16. The organic electroluminescent display as claimed in claim 13, wherein the desiccant material layer has a thickness of less than 200 μm.

* * * * *